US012637785B2

(12) United States Patent
Lee et al.

(10) Patent No.: US 12,637,785 B2
(45) Date of Patent: May 26, 2026

(54) INTAKE/EXHAUST DEVICE OF APPARATUS FOR CONTINUOUSLY GROWING SILICON INGOT

(71) Applicants: HANWHA SOLUTIONS CORPORATION, Seoul (KR); HANWHA CORPORATION, Seoul (KR)

(72) Inventors: Young Min Lee, Seoul (KR); Kyung Seok Lee, Seoul (KR); Han Woong Jeon, Seoul (KR)

(73) Assignees: HANWHA SOLUTIONS CORPORATION, Seoul (KR); HANWHA CORPORATION, Seoul (KR)

( * ) Notice: Subject to any disclaimer, the term of this patent is extended or adjusted under 35 U.S.C. 154(b) by 494 days.

(21) Appl. No.: 18/030,814

(22) PCT Filed: Sep. 16, 2021

(86) PCT No.: PCT/KR2021/012741
§ 371 (c)(1),
(2) Date: Sep. 7, 2023

(87) PCT Pub. No.: WO2022/075630
PCT Pub. Date: Apr. 14, 2022

(65) Prior Publication Data
US 2024/0240353 A1      Jul. 18, 2024

(30) Foreign Application Priority Data
Oct. 7, 2020    (KR) ........................ 10-2020-0129626

(51) Int. Cl.
C30B 15/20        (2006.01)
C30B 29/06        (2006.01)

(52) U.S. Cl.
CPC .............. C30B 15/20 (2013.01); C30B 29/06 (2013.01)

(58) Field of Classification Search
CPC ......... Y10T 117/1068; Y10T 117/1056; C30B 15/20; C30B 29/06
See application file for complete search history.

(56) References Cited

U.S. PATENT DOCUMENTS 6,231,669 B1 *  5/2001  Altekruger .............. C30B 15/02
                                                                117/214
2015/0259821 A1 *  9/2015  Kwon ..................... C30B 15/12
                                                                117/214

FOREIGN PATENT DOCUMENTS

CN        108138354 A      6/2018
CN        110608293 A     12/2019
                (Continued)

OTHER PUBLICATIONS

Communication issued May 31, 2024 in Chinese Application No. 202011404191.X.
                (Continued)

*Primary Examiner* — Robert M Kunemund
(74) *Attorney, Agent, or Firm* — Sughrue Mion, PLLC

(57) ABSTRACT

An intake/exhaust device of an apparatus for growing a silicon ingot includes: a chamber of which an inside is maintained in a vacuum atmosphere, and which includes a first section having a main crucible in a center thereof so that an ingot grows therein, and a second section having, on an outer side of an upper end thereof, a preliminary melting device for providing molten silicon to a main crucible; and a vacuum pump connected to the chamber to provide vacuum pressure, wherein a first section of the chamber has a first injection port through which inert gas for removing oxides and impurities inside the chamber flows, and a first exhaust port through which the inert gas is discharged, and
                (Continued)

the second section of the chamber also has a second injection port through which the inert gas flows, and a second exhaust port through which the inert gas is discharged.

8 Claims, 10 Drawing Sheets

(56) References Cited

FOREIGN PATENT DOCUMENTS

| | | | | | |
|----|----------------|----|---|--------|------------|
| DE | 4106589 | C2 | * | 4/1997 | ............ C30B 15/04 |
| JP | 05-105576 | A | | 4/1993 | |
| JP | 2888089 | B2 | | 5/1999 | |
| JP | 2009-1489 | A | | 1/2009 | |
| KR | 20-2009-0001417 | U | | 2/2009 | |
| KR | 10-2019-0031036 | A | | 3/2019 | |
| KR | 10-2137284 | B1 | | 7/2020 | |
| KR | 10-2271709 | B1 | | 7/2021 | |

OTHER PUBLICATIONS

Communication issued Oct. 31, 2024 in Chinese Application No. 202011404191.X.
Communication issued Mar. 12, 2025 in Chinese Application No. 202011404191.X.
International Search Report for PCT/KR2021/012741 dated Jan. 10, 2022 (PCT/ISA/210).
Communication dated Oct. 16, 2025 issued by the Intellectual Property India in application No. 202317030878.

* cited by examiner

【FIG. 1】
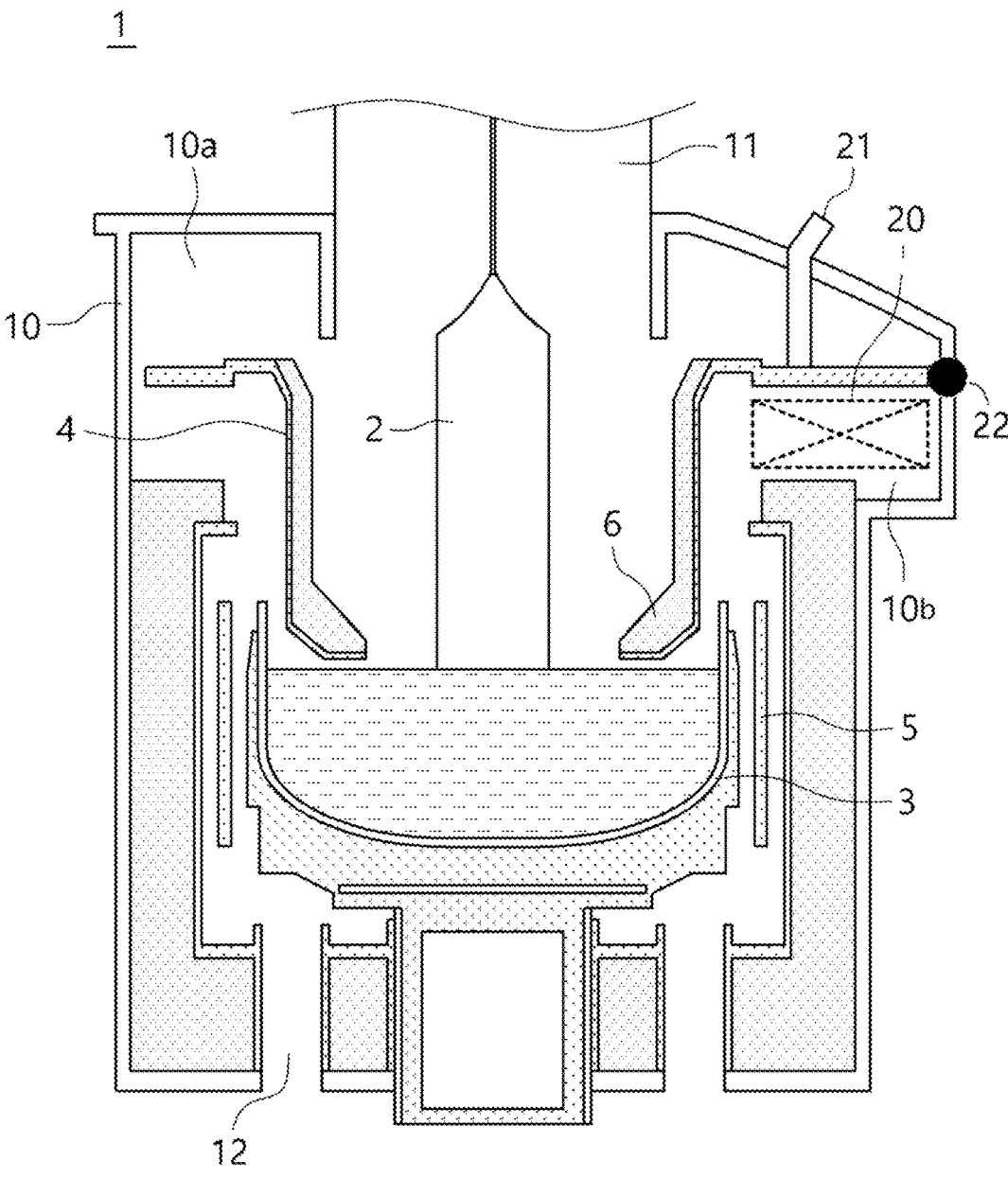

【FIG. 2】
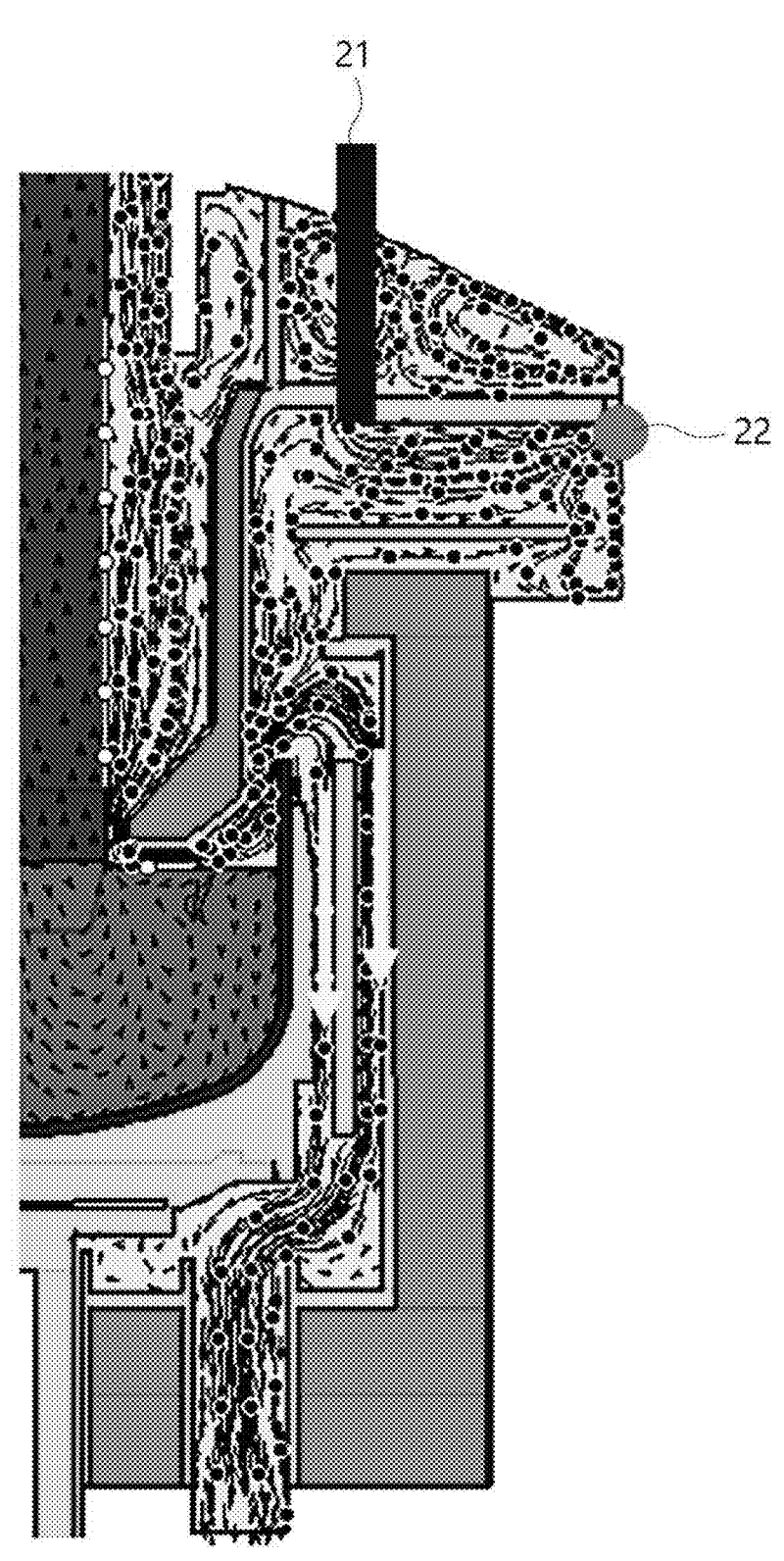

【FIG. 3】
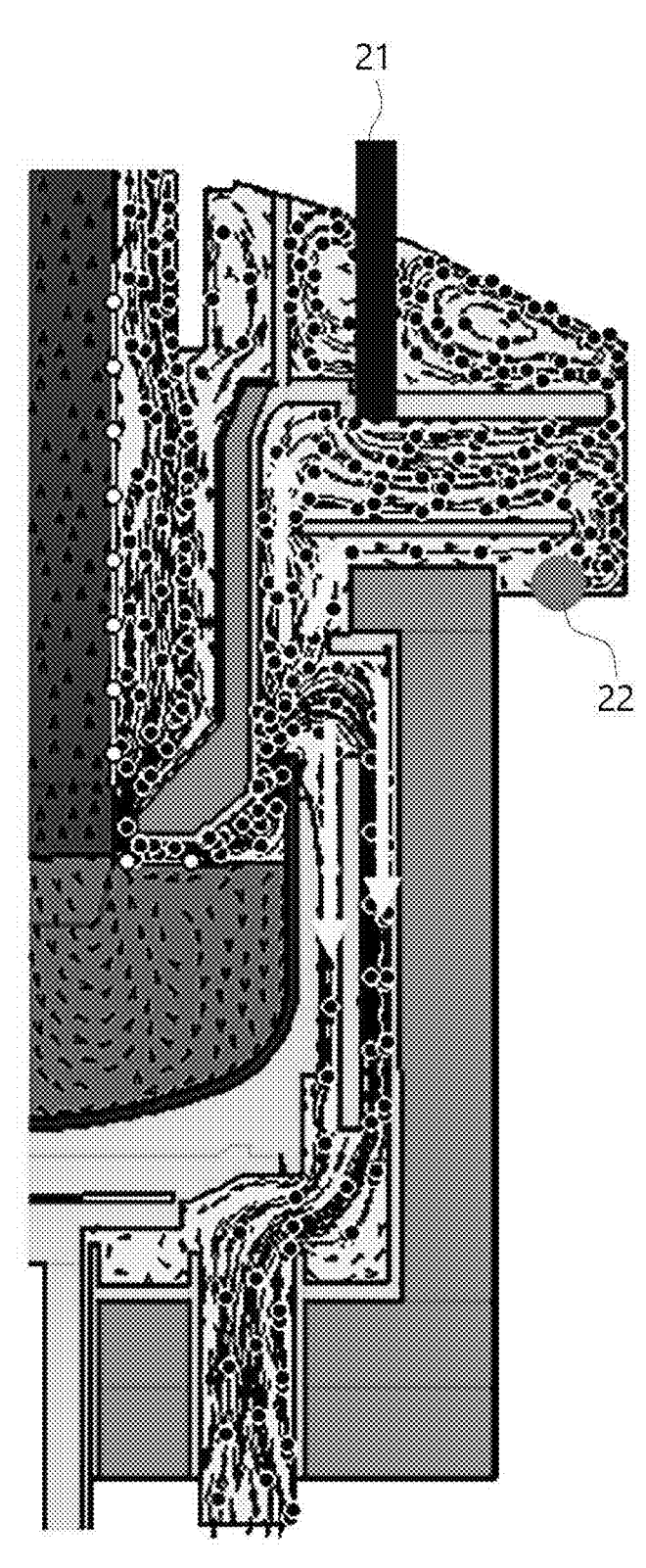

【FIG. 4】
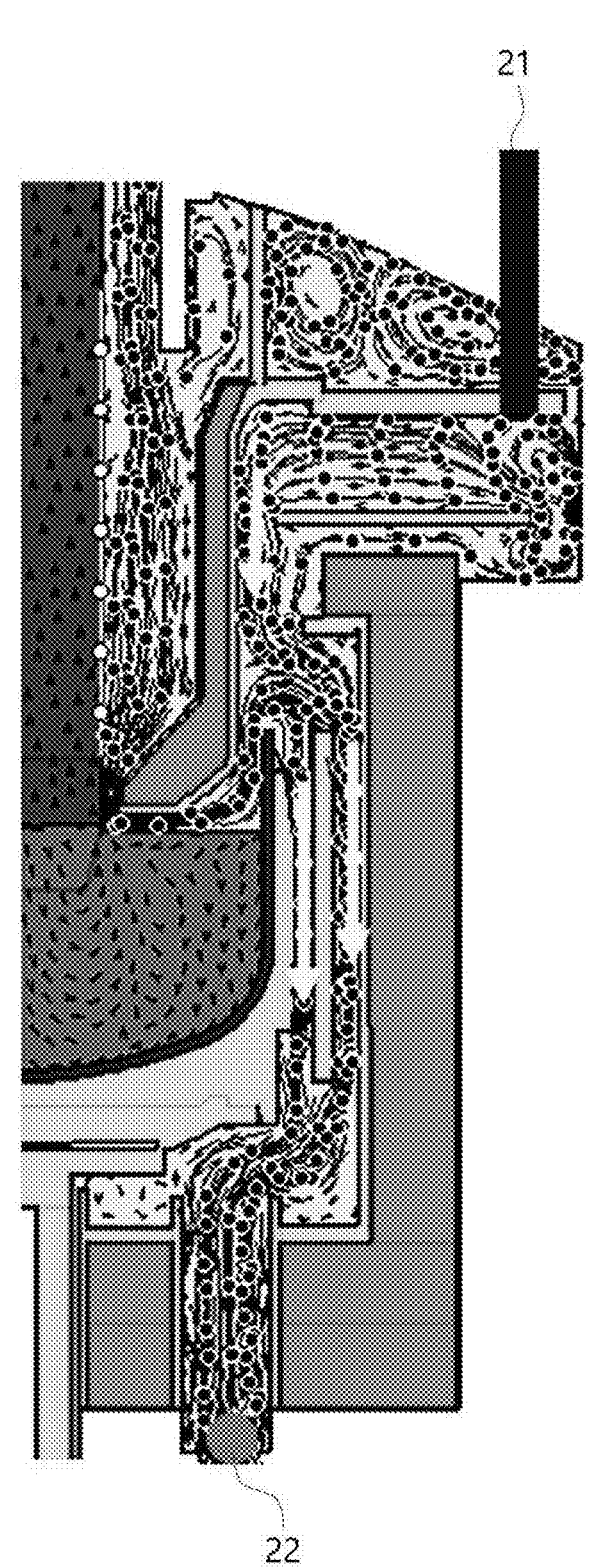

【FIG. 5】
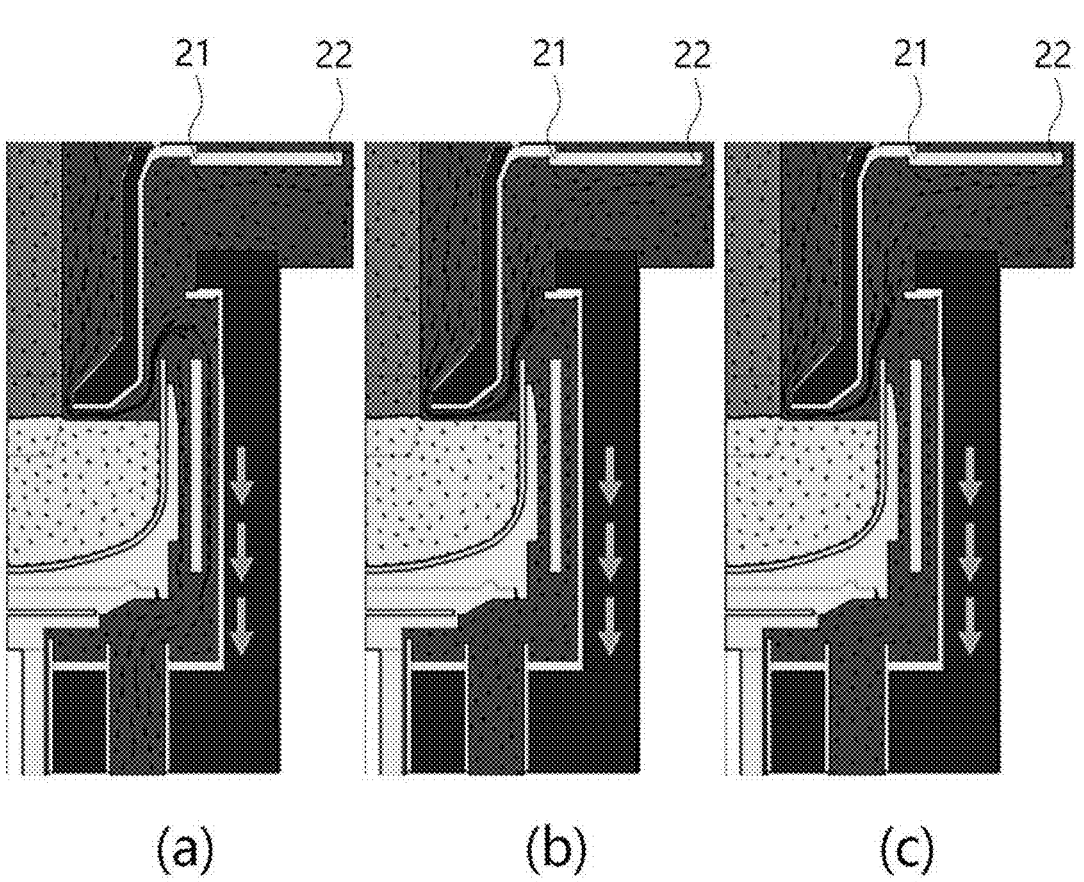
(a)          (b)          (c)

【FIG. 6】
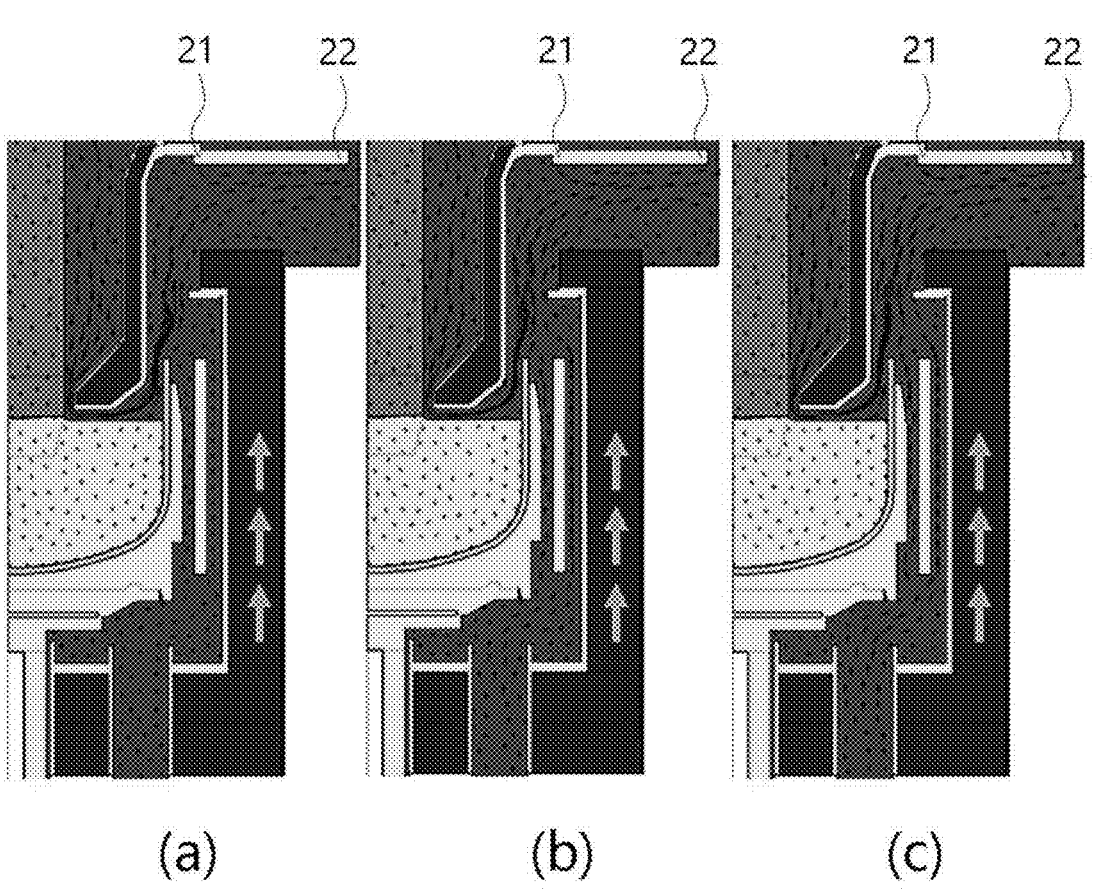
(a) (b) (c)

【FIG. 7】
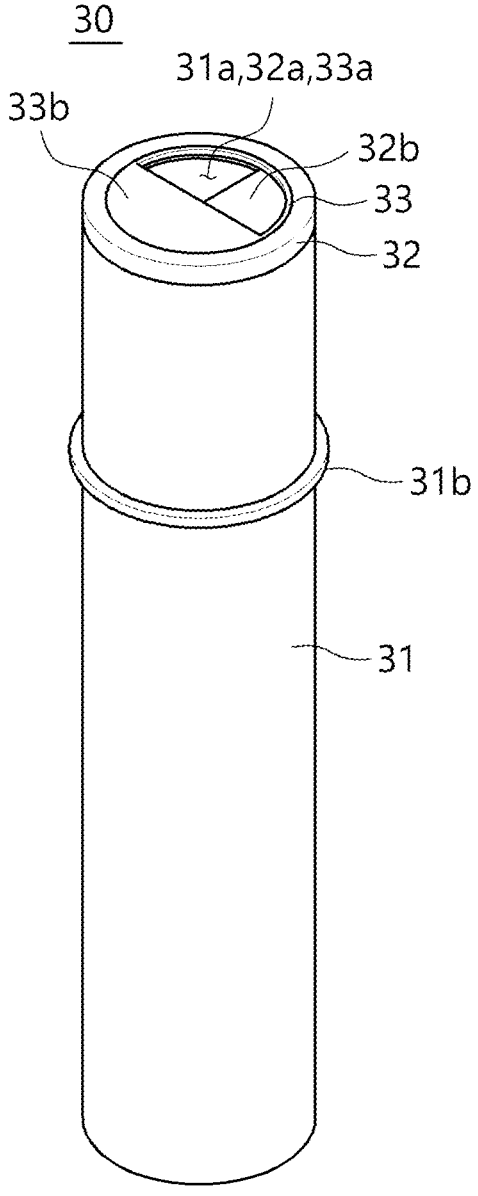

【FIG. 8】
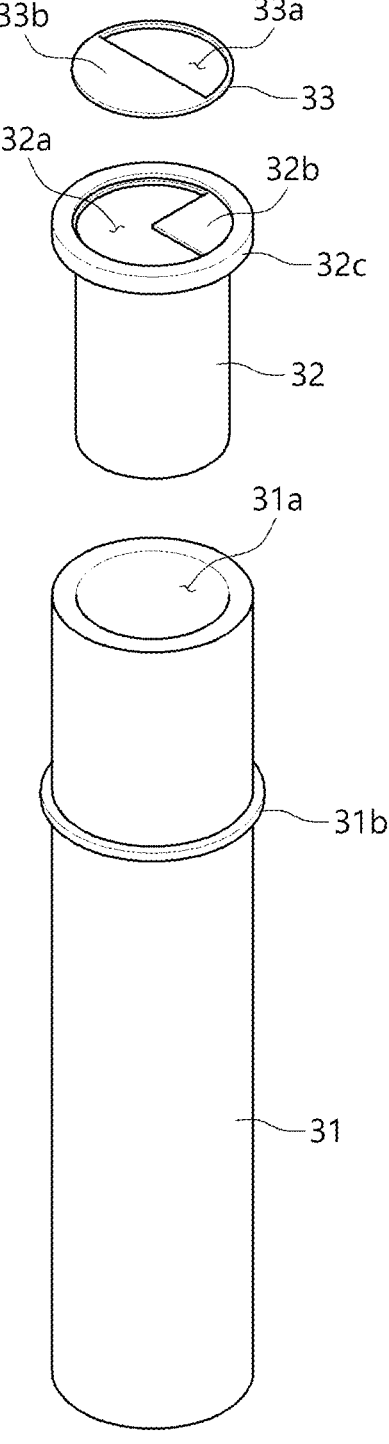

【FIG. 9】
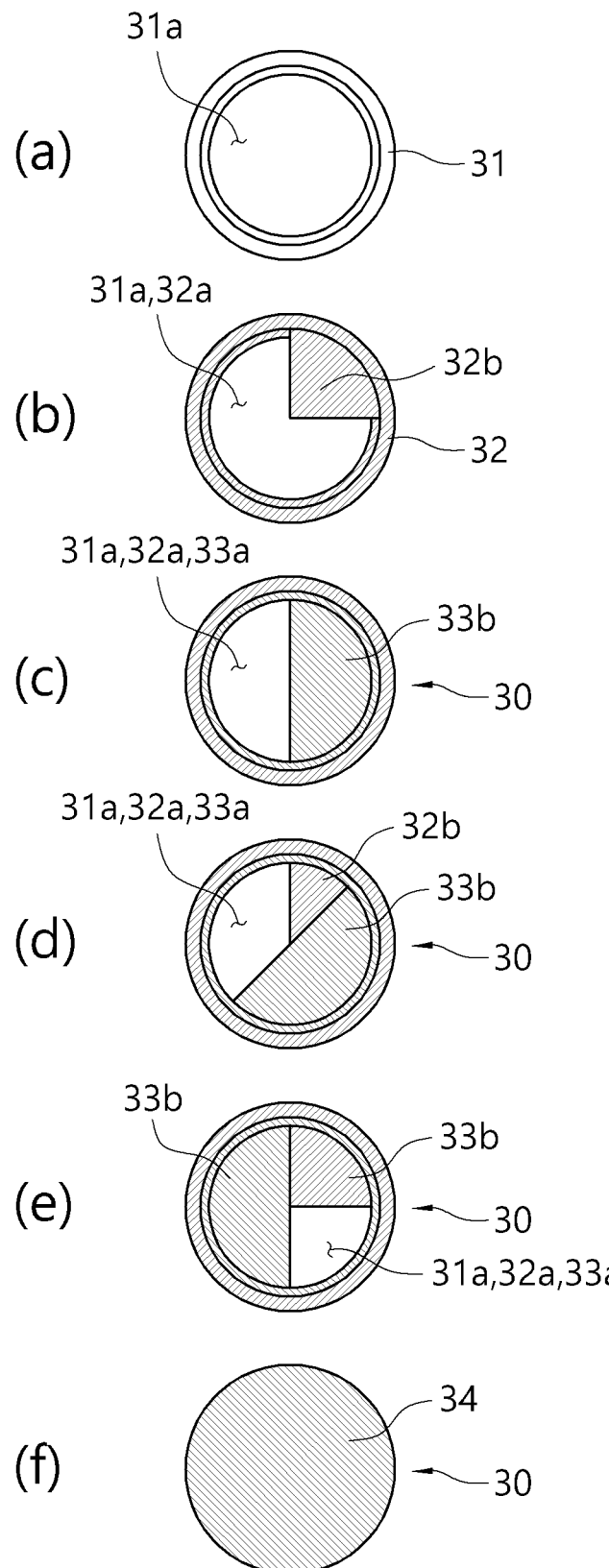

【FIG. 10】
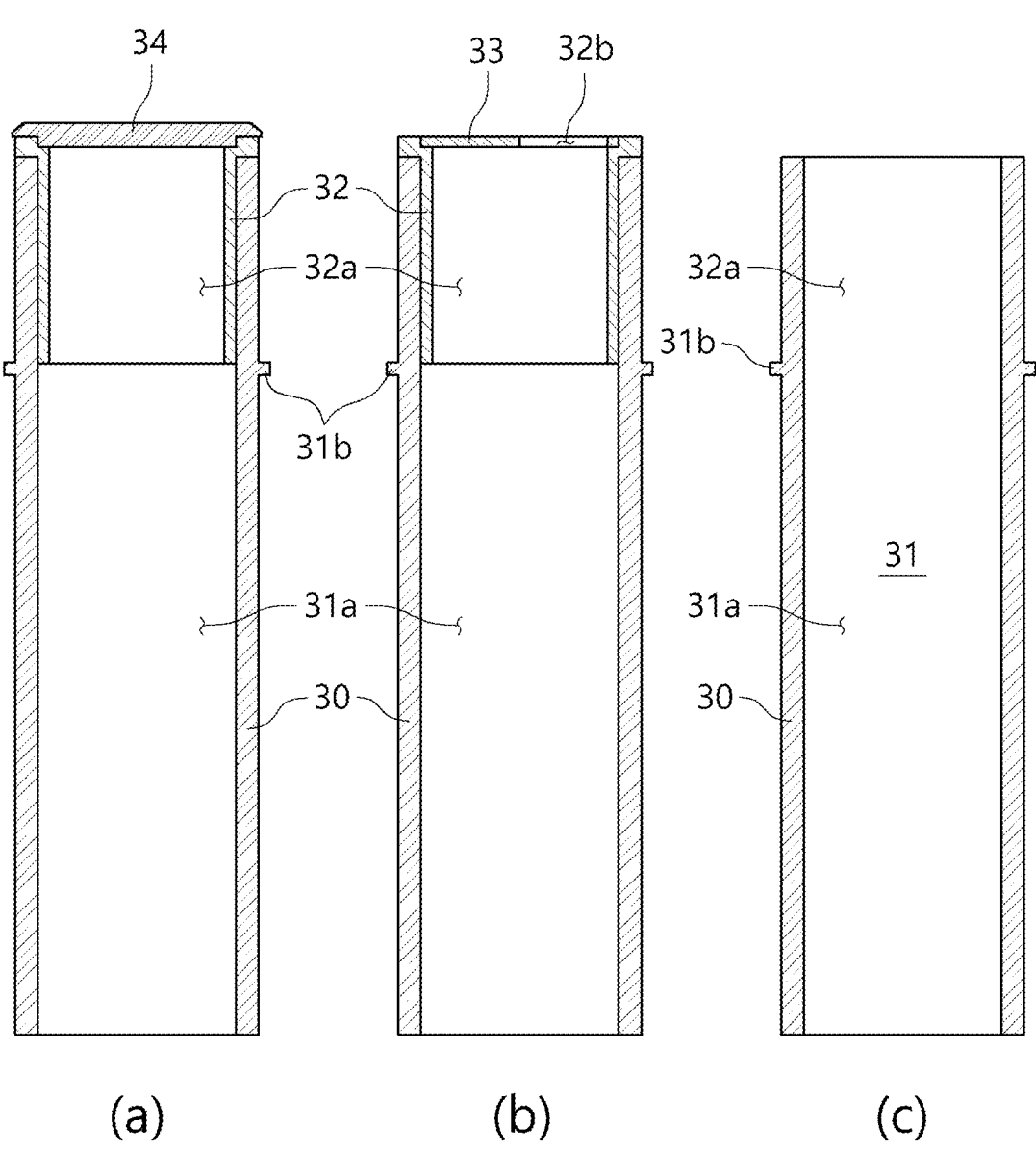
(a)                    (b)                    (c)

INTAKE/EXHAUST DEVICE OF APPARATUS FOR CONTINUOUSLY GROWING SILICON INGOT

CROSS-REFERENCE TO RELATED APPLICATION

This application is a National Stage of International Application No. PCT/KR2021/012741, filed Sep. 16, 2021, claiming priority based on Korean Patent Application No. 10-2020-0129626, filed on Oct. 7, 2020, the disclosure of which is incorporated herein by reference in its entirety.

TECHNICAL FIELD

The present invention relates to a device for growing an ingot for continuously growing a silicon ingot, and more specifically to an intake/exhaust device of an apparatus for continuously growing a silicon ingot for removing oxides and impurities.

BACKGROUND ART

In general, a grower using the Czochralski method is mounted inside a chamber, and a silicon ingot is grown inside the chamber in a vacuum atmosphere. In the Czochralski-based continuous single-crystal silicon growing method, there is a CCz structure that supplies solid poly-silicon from an initial method to an advanced method. This structure is a method of continuously supplying silicon to a crucible. A liquid feeding device that replaces such a CCz structure for suppling solid polysilicon has been developed that melts solid polysilicon in a liquid state in a preliminary melting device and supplies the same to a central quartz crucible. Accordingly, the need for an exhaust system for such a device has emerged.

In the related art associated with CCz, the vacuum atmo-sphere of the preliminary melting device and the main chamber is not connected, and in the system where the preliminary melting device is in a vacuum state, in order to facilitate the extraction of impurities, it has an advantageous structure for removing silicon oxide, particles and impurities by maintaining a pressure which is several millibars lower than the pressure inside the main chamber, but there has been a problem in that a separate chamber is required to make the preliminary melting device in a vacuum state.

DISCLOSURE

Technical Problem

The present invention is directed to providing an intake/exhaust device of an apparatus for continuously growing a silicon ingot that does not use a separate preliminary melting device chamber, and connects a preliminary device and a main chamber in one vacuum atmosphere, wherein silicon oxides, particles and impurities can be removed through the size and location of a gas injection port and a gas exhaust port for the preliminary melting device and the opening/closing valve structure of a main exhaust port.

Technical Solution

The intake/exhaust device of an apparatus for continu-ously growing a silicon ingot according to an aspect of the present invention may include a chamber of which the inside is maintained in a vacuum atmosphere, and which includes a first section having a main crucible provided in the center thereof such that an ingot grows therein, and a second section having, on the outer side of the upper end thereof, a preliminary melting device for providing molten silicon to the main crucible; and a vacuum pump which is connected to the chamber to provide vacuum pressure such that the inside thereof is maintained in a vacuum atmosphere, wherein the first section of the chamber has a first injection port through which inert gas for removing oxides and impurities inside the chamber flows, and a first exhaust port through which the gas is discharged, and the second section of the chamber also has a second injection port through which the inert gas flows, and a second exhaust port through which the gas is discharged.

In this case, the second injection port may penetrate the upper end of a boundary between the first section and the second section.

In this case, the second exhaust port may penetrate the outer upper end of the second section.

In this case, the chamber may be formed such that the second section protrudes from the first section.

In this case, the first injection port may be formed such that the inert gas flows downward through the central portion of the first section where the ingot rises.

In this case, the first exhaust port may be provided in the lower portion of the chamber.

In this case, the ratio of the diameters of the second exhaust port with respect to the first exhaust port may be 50:1 or more to 13:1 or less.

In this case, an opening/closing valve may be installed in the first exhaust port.

In this case, the opening/closing valve may include a first body in a cylindrical shape; a second body which is rotatably assembled to the first body and provided with a stopper in a radial shape at an upper end to partially block the passage of the inert gas; and a third body in a flat plate shape which is rotatably assembled to an upper end of the second body and provided with a stopper in a radial shape to partially block the passage of the inert gas together with the stopper of the first body.

In this case, the opening/closing valve may further include a plug which closes an upper end of the opening/closing valve to prevent the inert gas from passing there-through.

Advantageous Effects

According to the above configuration, the intake/exhaust device of an apparatus for continuously growing a silicon ingot according to the present invention does not need to provide a separate vacuum chamber for a preliminary melt-ing device, and thus, it is possible to reduce the installation cost.

In addition, since the present invention has a structure in which a main melting device and a preliminary melting device respectively have intake/exhaust systems while the main melting device and the preliminary melting device are connected in a vacuum atmosphere in one chamber, it is possible to effectively discharge oxides and impurities from each other.

DESCRIPTION OF DRAWINGS

FIG. 1 is a cross-sectional view of the intake/exhaust device of an apparatus for continuously growing a silicon ingot according to an exemplary embodiment of the present invention.

FIGS. 2 to 4 are schematic diagrams of experimental observation of the flow of inert gas by respectively forming an injection port and an exhaust port in different places in the intake/exhaust device of an apparatus for continuously growing a silicon ingot according to an exemplary embodiment of the present invention.

FIGS. 5 and 6 are schematic diagrams of experimental observation of the flow of inert gas by changing the diameter of a second exhaust port with respect to a first exhaust port in the intake/exhaust device of an apparatus for continuously growing a silicon ingot according to an exemplary embodiment of the present invention.

FIG. 7 is a perspective view of an opening/closing valve, which is a component of the intake/exhaust device of an apparatus for continuously growing a silicon ingot according to an exemplary embodiment of the present invention.

FIG. 8 is an exploded perspective view of an opening/closing valve, which is a component of the intake/exhaust device of an apparatus for continuously growing a silicon ingot according to an exemplary embodiment of the present invention.

FIG. 9 is a plan view showing each usage case of an opening/closing valve, which is a component of the intake/exhaust device of an apparatus for continuously growing a silicon ingot according to an exemplary embodiment of the present invention.

FIG. 10 is a cross-sectional view showing various assembly states of an opening/closing valve, which is a component of the intake/exhaust device of an apparatus for continuously growing a silicon ingot according to an exemplary embodiment of the present invention.

MODES OF THE INVENTION

Terms and words used in the present specification and claims should not be construed as limited to their usual or dictionary definition, and they should be interpreted as a meaning and concept consistent with the technical idea of the present invention based on the principle that inventors may appropriately define the terms and concept in order to describe their own invention in the best way.

Accordingly, the exemplary embodiments described in the present specification and the configurations shown in the drawings correspond to preferred exemplary embodiments of the present invention, and do not represent all the technical spirit of the present invention, and thus, the configurations may have various examples of equivalent and modification that can replace them at the time of filing the present invention.

It is understood that the terms "include" or "have", when used in the present specification, are intended to describe the presence of stated features, integers, steps, operations, elements, components and/or a combination thereof but do not preclude the possibility of the presence or addition of one or more other features, integers, steps, operations, elements, components or a combination thereof.

The presence of an element in/on "front", "rear", "upper or above or top" or "lower or below or bottom" of another element includes not only being disposed in/on "front", "rear", "upper or above or top" or "lower or below or bottom" directly in contact with other elements, but also cases in which another element being disposed in the middle, unless otherwise specified. In addition, unless otherwise specified, that an element is "connected" to another element includes not only direct connection to each other but also indirect connection to each other.

Hereinafter, the intake/exhaust device of an apparatus for continuously growing a silicon ingot according to the present invention will be described with reference to the drawings. In the present specification, in terms of describing the intake/exhaust device of an apparatus for continuously growing a silicon ingot according to an exemplary embodiment of the present invention, the configurations that are not related to the contents of the present invention are not illustrated in detail or omitted for the sake of simplification of the drawings, and the intake/exhaust device of an apparatus for continuously growing a silicon ingot according to the present invention will be described by mainly focusing on the contents that are related to the spirit of the invention.

With reference to FIGS. 1 to 8, the intake/exhaust device of an apparatus for continuously growing a silicon ingot 1 according to an exemplary embodiment of the present invention may include a chamber 10, a vacuum pump (not illustrated) and an opening/closing valve 30.

Referring to FIGS. 1 to 5, in the chamber 10, the inside is maintained in a vacuum atmosphere, and a main crucible 3 which is heated by a heater 5 is installed in the center such that it may include a first section 10*a* where an ingot 2 is grown and a second section 10*b* where a preliminary melting device 20 for providing molten silicon to the main crucible 3 is provided outside the upper end.

In this case, the chamber 10 is formed in a cylindrical shape, and the main crucible 3 may be installed in the center. Referring to FIG. 1, since the chamber 10 is a form in which the preliminary melting device 20 is added to the outer side of the upper end, a space must be provided therefor. Accordingly, the chamber 10 may be formed such that the outer side of the upper end protrudes outward compared to other parts. That is, the space required to add the second section 10*b* is added in the outward direction. Certainly, in this state, only the original first injection port 11 and the first exhaust port 12 may be formed to configure the intake/exhaust device, but by the addition of the preliminary melting device 20, it results in a problem where the flow of the original inert gas is changed. In order to improve this, the second injection port 21 and the second exhaust port 22 may be provided in the second section 10*b*.

A vacuum atmosphere is maintained inside the chamber 10 by a vacuum pump which is connected to the first and second exhaust ports 12, 22. That is, the vacuum pump may be connected to the chamber 10 to provide a vacuum pressure to maintain a vacuum atmosphere therein.

In this case, a first injection port 11 through which inert gas for removing oxides and impurities inside the chamber 10 is introduced and a first exhaust port 12 through which it is discharged may be provided in the first section 10*a* of the chamber 10, and a second injection port 21 through which the inert gas is introduced and a second exhaust port 22 through which the inert gas is discharged may also be provided in the second section 10*b* of the chamber 10.

In this case, the inert gas may be introduced downward through the central portion of the first section 10*a* in which the ingot 2 rises through the first injection port 11.

Meanwhile, the first exhaust port 12 may be located at a lower portion of the chamber 10.

Therefore, the inert gas which has been introduced into the first injection port 11 passes between the main crucible 3 and the reflector 4 to move to a side surface, and then descends along the side surface of the main crucible 3, and then, it may be discharged to outside of the chamber through the first exhaust port 12. In this case, argon gas may be used as the inert gas, and the flow of the inert gas may be discharged by pushing oxides and impurities.

In this case, the second injection hole 22 may be formed through the upper end of a boundary between the first section 10a and the second section 10b. By allowing the inert gas to flow into the boundary in this way, an air curtain effect is achieved, and the first section 10a and the second section 10b may be partitioned spatially or in terms of gas flow.

In this case, the second exhaust port 22 may be formed through an outer upper end of the second section 10b. That is, the second exhaust port 22 may be disposed at an outside position among the highest places in the second section 10b.

The selection of the positions of the second injection port 21 and the second exhaust port 22 may be performed with reference to the simulation experimental example.

FIGS. 2 to 4 are diagrams in which experiments were performed to capture the flow of gas by changing the positions in a state where the amount of argon injected into the second injection port 21 was 15 lpm (liter per minute), and the diameter of the second exhaust port 22 was 2 mm.

In this case, as shown in FIG. 2, when the second injection port 21 is disposed at the boundary of the first and second sections 10a, 10b and the second exhaust port 22 is disposed at the top, it has been possible to discharge oxides that are generated in the crucible 3 where the ingot is grown and oxides that are generated in the preliminary melting device 20.

Meanwhile, as shown in FIG. 3, when the second injection port 21 is the same as that in FIG. 2 and the second exhaust port 22 is disposed at the lower end, there has been a disadvantage in that oxides that are generated in the crucible 3 where the ingot is grown could be introduced into the molten silicon of the preliminary melting device 20.

In this case, as shown in FIG. 4, when only the second injection port 21 of the molten silicon is present and only the first exhaust port 12 is installed as an exhaust port, there has been a possibility that oxides that are generated in the preliminary melting device 20 could be introduced into molten silicon where the ingot is grown.

According to the above-described experimental results, in the intake/exhaust device of an apparatus for continuously growing a silicon ingot 1 according to an exemplary embodiment of the present invention, the second injection port 21 and the second exhaust port 22 may be disposed in the apparatus for continuously growing an ingot 1 in the form illustrated in FIG. 2.

Meanwhile, in addition to the injection port and the exhaust port, the gas flow inside the chamber 10 may also be affected by the size of the diameter of an exhaust port.

For example, as a result of the simulation, when the diameter of the second exhaust port 22 of the preliminary melting device 20 was set to 30 mm, which is ⅓ of the size of the pipe diameter of the first exhaust port 12 at 94 mm, it was confirmed that the argon gas flowed backward.

When the argon gas flows backward, carbon of the graphite structure at the bottom may flow into the molten silicon where the ingot grows, which may have an adversely effect in terms of the quality of products. In addition, when oxide deposits or dust come into contact with the surface on which the ingot is grown due to the backflow of the argon gas, it may cause crystal defects and decrease productivity.

Meanwhile, FIGS. 5 and 6 are diagrams in which the flow of gas was experimentally observed by changing the diameter of the second exhaust port 22 in a state where the second injection port 21, the first exhaust port 12 and the second exhaust port 22 were formed at the same positions as shown in FIG. 2. In this case, in FIGS. 5 and 6, the amount of argon injected into the second injection port 21 was 15 lpm (liter per minute), and the pipe diameter of the first exhaust port 12 was 94 mm.

In FIG. 5, the diameter of the second exhaust port 22 was set to (a) 2 mm, (b) 5 mm and (c) 6 mm, respectively, and when having a second exhaust port diameter of the same size as in FIG. 5, it can be confirmed that the flow of argon gas (in the lower arrow direction) was made smoothly.

Meanwhile, in FIG. 6, the diameter of the second exhaust port 22 was set to (a) 7 mm, (b) 15 mm and (c) 30 mm, respectively, and when having a second exhaust port diameter of the same size as in FIG. 6, it can be confirmed that a backflow (in the upper arrow direction) occurred in the flow of argon gas.

According to the experimental results, when the amount of argon injected into the second injection port 21 was 15 lpm (liter per minute) and the pipe diameter of the first exhaust port 12 was 94 mm, no backflow occurred when the diameter of the second exhaust port 22 was set to less than 7 mm.

Therefore, according to an exemplary embodiment of the present invention, when the diameter of the second exhaust port 22 is set to 6 mm, the manufacture may be easy under the conditions where the amount of argon injected into the second injection port 21 is 15 lpm (liter per minute) and the pipe diameter of the first exhaust port 12 is 94 mm, because no backflow occurs, and it has the largest diameter among the diameters in which backflow does not occur.

According to the experimental results, when the diameter ratio of the first exhaust port and the second exhaust port is set to 50:1 or more to 13:1 or less, and more preferably, when the diameter ratio is set to 16:1 or more to 13:1 or less, it is possible to manufacture a grower so that no backflow occurs in the flow of fluid passing through the injection port and exhaust port.

In this case, the opening/closing valve 30 may be installed in the first exhaust port 12.

In this case, with reference to FIGS. 7 to 10, the opening/closing valve 30 may include a first body 31 to a third body 33.

The first body 31 may be formed in a cylindrical shape such that a gas passage 31a is provided in the center, and a locking jaw 31b for assembly may be provided.

The second body 32 may be rotatably assembled to the first body 31 and include a stopper 32b in a radial shape at an upper end to partially block the passage 32a of the inert gas. Herein, the stopper 32b is provided to block about 90 degrees, but the present invention is not limited thereto.

In this case, a flange 32c may be provided on the upper end of the second body 32 so as to be assembled by being hooked on the upper end of the first body 31. Accordingly, when the outer diameter of the second body 32 is formed to be smaller than the inner diameter of the first body 31 and the second body 32 is inserted into the first body 31, the flange 32c is hooked on the first body 31, and the insertion is stopped such that the assembly may be performed.

The third body 33 may be rotatably assembled to the upper end of the second body 32, and may be provided with a stopper 33b in a radial shape so as to partially block the passage 323a of the inert gas together with the stopper 32b of the second body 32.

In this case, the third body 33 is provided with a gas passage 33a and a stopper in a disk shape, and the stopper 33b may be formed to block about 180 degrees, but the present invention is limited thereto.

In this case, the opening/closing valve 30 may further include a plug 34 for closing the upper end of the opening/ closing valve 30 to prevent the inert gas from passing therethrough. The plug 34 may be assembled to block the gas passages 31a, 32a, 33a instead of or on the third body 33 in the opening/closing valve 30.

FIGS. 7 and 8 show a state in which the first to third bodies 31, 32, 33 are assembled, and a state in which only 25% of the gas passages 31a, 32a, 33a are opened with a radius of about 45 degrees of the gas passages 31a, 32a, 33a open.

to (f) of FIG. 9 illustrate states in which the gas passage of the opening/closing valve 30 is opened to different degrees of opening. (a) of FIG. 9 is a state in which only the first body 31 is installed in the first exhaust port 12, and it is in a 100% open state. (b) of FIG. 9 is a state in which only the first body 31 and the second body 32 are assembled to the first exhaust port 12, and 75% of the gas passage is open. (c) of FIG. 9 is a state in which the stopper 33b of the third body 33 overlaps with the stopper 33b of the third body 33 to be opened only 50% in a state where the first body 31 to the third body 33 are assembled. (d) of FIG. 9 and (e) of FIG. 9 are states in which the third body 33 is rotated at a desired angle in the state in (c) of FIG. 9, and the degree of opening of the gas passage can be adjusted from 50% to 75%. (f) of FIG. 9 shows a state in which the first exhaust port is closed by assembling the plug 34 at the upper end. According to an exemplary embodiment of the present invention, as shown in (a) to (f) of FIG. 9, the flow rate of the gas flowing through the gas passage may be controlled by adjusting the degree of opening of the opening/closing valve 30.

Meanwhile, (a) of FIG. 10 is a state in which the plug 34 is installed at the upper end of the opening/closing valve to close the gas passage. (b) of FIG. 10 is a state in which the first body 31 to the third body 33 are all installed at the upper end of the opening/closing valve to adjust the degree of opening of the gas passage. (c) of FIG. 10 is a state in which only the first body 31 is installed in the first exhaust port 12 such that the gas passage is completely opened. According to an exemplary embodiment of the present invention, by configuring as shown in (a) to (c) of FIG. 10, the flow rate of the gas flowing through the gas passage may be controlled by adjusting the degree of opening of the opening/closing valve 30.

As described above, according to an exemplary embodiment of the present invention, by adjusting the degree of opening of the opening/closing valve 30, the flow of gas passing through the first exhaust port having a large diameter may be controlled according to the surrounding environment and circumstances.

Although the exemplary embodiments of the present invention have been described, the spirit of the present invention is not limited by the exemplary embodiments presented herein, and a person skilled in the art who understands the spirit of the present invention may easily suggest other exemplary embodiments by modifying, changing, deleting or adding components within the scope of the same spirit, but this will also be within the spirit of the present invention.

INDUSTRIAL APPLICABILITY

The present invention can be applied to an apparatus for manufacturing a solar wafer.

The invention claimed is:

1. An intake/exhaust device of an apparatus for continuously growing a silicon ingot, comprising:
   a chamber of which an inside is maintained in a vacuum atmosphere, and which includes a first section having a main crucible provided in a center thereof such that an ingot grows therein, and a second section having, on an outer side of an upper end thereof, a preliminary melting device configured to provide molten silicon to the main crucible; and
   a vacuum pump which is connected to the chamber to provide vacuum pressure such that the inside thereof is maintained in the vacuum atmosphere,
   wherein the first section of the chamber has a first injection port through which an inert gas for removing oxides and impurities inside the chamber flows, and a first exhaust port through which the inert gas is discharged, and the second section of the chamber also has a second injection port through which the inert gas flows, and a second exhaust port through which the inert gas is discharged,
   wherein the second injection port penetrates an upper end of a boundary between the first section and the second section to inject the inert gas into the boundary so as to partition the first section and the second section, and the second exhaust port penetrates an outer upper end of the second section, and
   wherein the second injection port and the second exhaust port are positioned above the preliminary melting device.

2. The intake/exhaust device of claim 1, wherein the chamber is formed such that the second section protrudes from the first section.

3. The intake/exhaust device of claim 1, wherein the first injection port is formed such that the inert gas flows downward through the center of the first section where the ingot rises.

4. The intake/exhaust device of claim 1, wherein the first exhaust port is provided in a lower portion of the chamber.

5. The intake/exhaust device of claim 1, wherein a ratio of diameters of the second exhaust port with respect to the first exhaust port is between 13:1 and 50:1.

6. The intake/exhaust device of claim 1, wherein an opening/closing valve is installed in the first exhaust port.

7. The intake/exhaust device of claim 6, wherein the opening/closing valve comprises:
   a first body in a cylindrical shape;
   a second body which is rotatably assembled to the first body and provided with a stopper in a radial shape at an upper end to partially block a passage of the inert gas; and
   a third body in a flat plate shape which is rotatably assembled to an upper end of the second body and provided with a stopper in a radial shape to partially block the passage of the inert gas together with the stopper of the first body.

8. The intake/exhaust device of claim 7, wherein the opening/closing valve further comprises a plug which closes an upper end of the opening/closing valve to prevent the inert gas from passing therethrough.

* * * * *